(12) United States Patent
Manipatruni et al.

(10) Patent No.: US 9,281,467 B2
(45) Date of Patent: Mar. 8, 2016

(54) SPIN HALL EFFECT MEMORY

(75) Inventors: Sasikanth Manipatruni, Hillsboro, OR (US); Dmitri Nikonov, Beaverton, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 518 days.

(21) Appl. No.: 13/537,541

(22) Filed: Jun. 29, 2012

(65) Prior Publication Data

US 2014/0001524 A1    Jan. 2, 2014

(51) Int. Cl.
| | |
|---|---|
| H01L 43/08 | (2006.01) |
| H01L 49/02 | (2006.01) |
| H01L 27/22 | (2006.01) |
| G11C 11/18 | (2006.01) |

(52) U.S. Cl.
CPC ............... H01L 43/08 (2013.01); G11C 11/18 (2013.01); H01L 27/222 (2013.01); H01L 27/228 (2013.01); H01L 28/65 (2013.01)

(58) Field of Classification Search
CPC ...... G11C 11/18; H01L 27/228; H01L 43/08; H01L 28/65; H01L 27/11502; H01L 27/11507; H01L 27/222; H01L 27/226; H01L 43/04; H01L 43/06; H01L 2924/1441
USPC ............ 257/295, E27.104, E21.208, E21.664
See application file for complete search history.

(56) References Cited

U.S. PATENT DOCUMENTS

| 8,686,525 B2 * | 4/2014 | Saitoh et al. ................ 257/427 |
| 2009/0075399 A1 * | 3/2009 | Sakato et al. ................ 438/3 |
| 2010/0102369 A1 * | 4/2010 | Tian et al. ................ 257/295 |
| 2012/0012956 A1 | 1/2012 | Saitoh | |
| 2012/0069647 A1 | 3/2012 | Kramer | |

FOREIGN PATENT DOCUMENTS

| JP | 2009-158554 | 7/2009 |
| JP | 2009-295824 | 12/2009 |
| TW | 201218199 | 5/2012 |

(Continued)

OTHER PUBLICATIONS

Patent Cooperation Treaty, Notification of Transmittal of the International Search Report and the Written Opinion of the International Searching Authority mailed Oct. 28, 2013, for international application No. PCT/US2013/048028.

(Continued)

*Primary Examiner* — Jose R Diaz
(74) *Attorney, Agent, or Firm* — Trop, Pruner & Hu, P.C.

(57) ABSTRACT

An embodiment of the invention includes a memory cell having a magnet layer coupled to a metal layer and read line. The metal layer is also coupled to write and sense lines. During a write operation charge current is supplied to the metal layer via the write line and induces spin current and a magnetic state within the magnet layer based on the spin Hall effect. During a read operation read current is supplied, via the read line, to the magnet layer and then the metal layer and induces another spin current, within the metal layer, that generates an electric field and voltage, based on inverse spin Hall effect, at a sense node coupled to the sense line. The voltage polarity is based on the aforementioned magnetic state. The memory operates with a low supply voltage to drive charge, read, and spin currents. Other embodiments are described herein.

26 Claims, 15 Drawing Sheets

(56) References Cited

FOREIGN PATENT DOCUMENTS

WO 2008-123023 10/2008
WO WO 2010110297 A1 * 9/2010

OTHER PUBLICATIONS

Arne Brataas, et al. "Current-Induced Torques in Magnetic Materials", Nature Materials, May 2012, vol. 11, No. 5, published on-line on Apr. 23, 2012. (http://www.nature.com/nmat/journal/vll/n5/index.html).

I. M. Miron, et al., "Current-driven spin torque induced by the Rashba effect in a ferromagnetic metal layer," Mar. 2010, 5 pages.

Luqiao Liu, et al., "Spin-Torque Switching with the Giant Spin Hall Effect of Tantalum," Jun. 22, 2012, 5 pages.

Taiwanese Patent Office, Office Action dated Apr. 15, 2015 in Taiwan application No. 102121118.

\* cited by examiner

| cell | WL | BL_read | BL_write | Sense |
|---|---|---|---|---|
| A | +V | Disable (High Z) | +V/-V | Disable (High Z) |
| B | +V | Disable (High Z) | Disable (High Z) | Disable (High Z) |
| C | 0 | Disable (High Z) | +V/-V | Disable (High Z) |
| D | 0 | Disable (High Z) | Disable (High Z) | Disable (High Z) |

FIG. 5c

| cell | WL | BL_read | BL_write | Sense |
|---|---|---|---|---|
| A | +V | +V | Disable (High Z) | Enable (High Z) |
| B | +V | Disable (High Z) | Disable (High Z) | Disable (High Z) |
| C | 0 | +V | Disable (High Z) | Enable (High Z) |
| D | 0 | Disable (High Z) | Disable (High Z) | Disable (High Z) |

| cell | WL | BLread | BLwrite | Sense |
|---|---|---|---|---|
| A | +V | Disable (High Z) | +V/-V | Disable (High Z) |
| B | +V | Disable (High Z) | Disable (High Z) | Disable (High Z) |
| C | 0 | Disable (High Z) | +V/-V | Disable (High Z) |
| D | 0 | Disable (High Z) | Disable (High Z) | Disable (High Z) |

| cell | WL | BLread | BLwrite | Sense |
|---|---|---|---|---|
| A | +V | +V | Disable (High Z) | Enable (High Z) |
| B | +V | Disable (High Z) | Disable (High Z) | Disable (High Z) |
| C | 0 | +V | Disable (High Z) | Enable (High Z) |
| D | 0 | Disable (High Z) | Disable (High Z) | Disable (High Z) |

SPIN HALL EFFECT MEMORY

BACKGROUND

Some magnetic memories, such as a spin transfer torque random access memory (STTRAM), utilize a magnetic tunnel junction (MTJ) for switching and detection of the memory's magnetic state. As shown in FIG. 1, a MTJ consists of ferromagnetic (FM) layers 125, 127 and tunneling bather 126 (e.g., MgO). The MTJ couples bit line (BL) 105 to selection switch 120 (e.g., transistor), word line (WL) 110, and sense line (SL) 115. Memory 100 is "read" by assessing the change of resistance (e.g., tunneling magnetoresistance (TMR)) for different relative magnetizations of FM layers 125, 127.

BRIEF DESCRIPTION OF THE DRAWINGS

FIGS. 5a, 5b, and 5c depict write operations in an embodiment of the invention.

DETAILED DESCRIPTION

Figure 1:
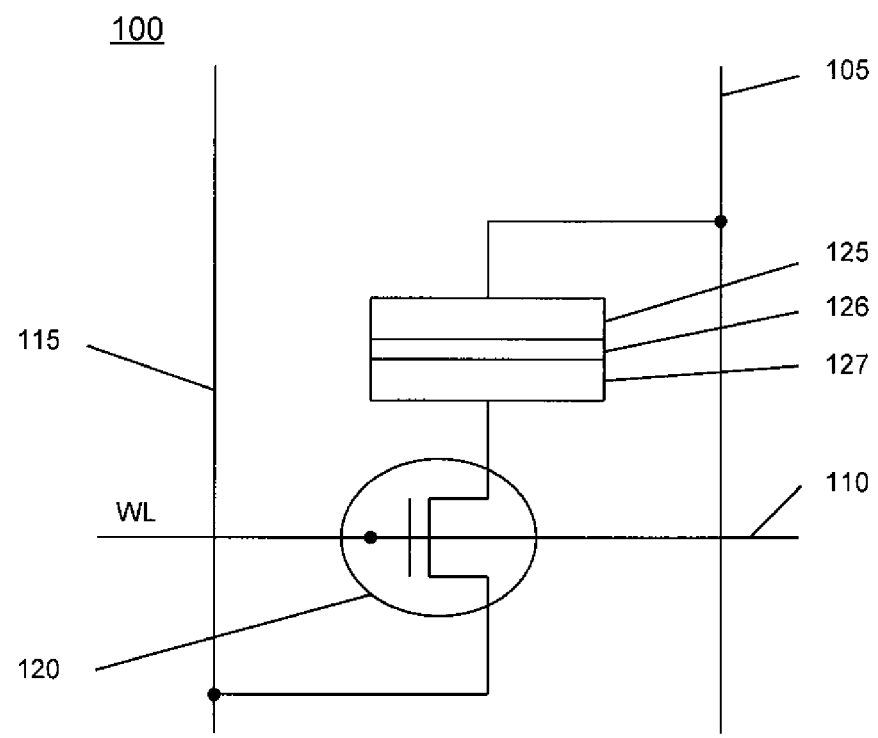
FIG. 1 depicts a conventional magnetic memory cell.

In the following description, numerous specific details are set forth but embodiments of the invention may be practiced without these specific details. Well-known circuits, structures and techniques have not been shown in detail to avoid obscuring an understanding of this description. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact. Also, while similar or same numbers may be used to designate same or similar parts in different figures, doing so does not mean all figures including similar or same numbers constitute a single or same embodiment.

Technical difficulties exist for MTJ based memories. For MgO devices, as an example, those difficulties include the need to control MgO thicknesses and uniformity to ensure the desired TMR. Also, proper device function is dependent on precise crystal order and crystal axis orientation for the MgO. Also, MgO breaks down under even modest bias levels (e.g., 0.6 V). Furthermore, there is TMR degradation after many MTJ switching cycles.

An embodiment of the invention includes a memory cell having a magnet layer coupled to a metal layer and read line. The metal layer is also coupled to write and sense lines. During a write operation charge current is supplied to the metal layer via the write line and induces spin current and a magnetic state within the magnet layer based on the spin Hall effect (SPE). SPE generates large spin polarized currents, in certain metals (e.g., platinum, tantalum, gold and other metals with high spin orbit coupling), from normal electrical currents. During a read operation read current is supplied, via the read line, to the magnet layer and then to the metal layer and induces another spin current, within the metal layer, that generates an electric field and voltage, based on inverse spin Hall effect (ISHE), at a sense node coupled to the sense line. ISHE is the generation of a voltage in response to a spin polarized current in a metal with high spin orbit coupling. The voltage polarity is based on the aforementioned magnetic state created during a write operation. The memory needs only a low supply voltage to drive charge, read, and spin currents. Other embodiments are described herein.

Figure 2A:
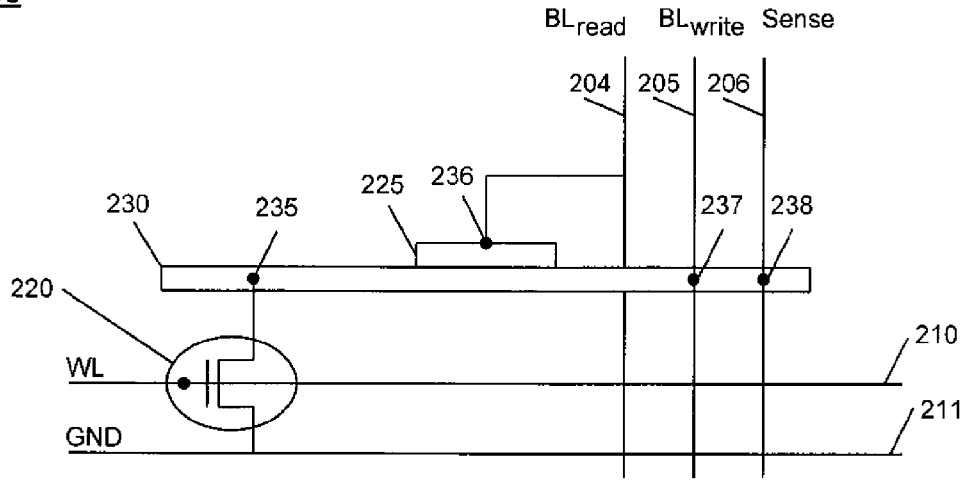
FIGS. 2a, 2b, and 2c depict views of a memory cell in an embodiment of the invention.
Figure 2B:
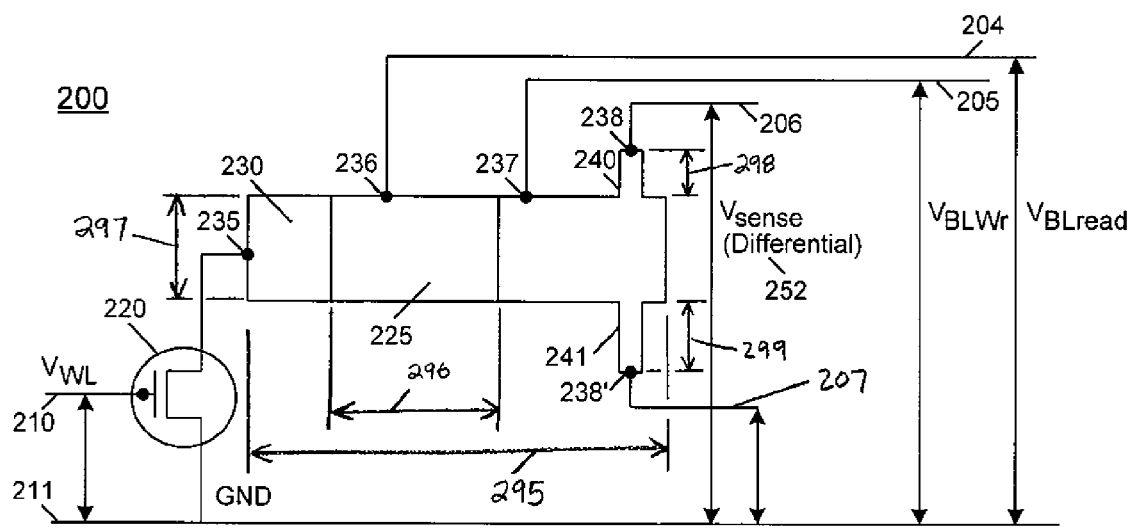

FIGS. 2a and 2b depict different views of a memory cell in an embodiment of the invention. Memory cell 200 includes magnet layer 225. Layer 225 may be a FM layer for preserving the state of memory 200. Layer 225 may include at least one of nickel, cobalt, iron, Huesler alloy, gadolinium, and combinations thereof but other embodiments are not so limited. In an embodiment any element for layer 225 may be doped with, for example, boron or similar materials (e.g., to assist in nanofabrication). Another embodiment includes materials, similar to nickel, cobalt, iron, Huesler alloy, and gadolinium, which are suitable for layer 225 because, for example, they have good magnetization at room temperature and/or strong magnetic anisotropy. In one embodiment magnet layer 225 couples directly to high SHE metal layer 230. In other embodiments layer 225 may couple indirectly (e.g., via an intermediate layer or very short via) to layer 230.

In one embodiment, layer 230 includes a spin orbit coupling material comprising at least one of platinum, tantalum, copper, and gold (and combinations thereof), but other embodiments are not so limited. Other embodiments may include copper combined with an impurity. The impurity may include one or more 5d transition metals such as hafnium, tantalum, tungsten, rhenium, osmium, iridium, platinum, gold, and mercury. The tantalum may include beta phase tantalum in one embodiment. Other embodiments may include one or more these impurities combined with gold, silver, and/or platinum. Still other embodiments may include gold, silver, and/or platinum combined with one or more 4d transition metal impurities such as yttrium, zirconium, niobium, molybdenum, technetium, ruthenium, rhodium, palladium, silver, and/or cadmium. Another embodiment may include mercury and tellurium. Still other embodiments may include artificially engineered metallic structures such as magnetic superlattices and other meta materials. Other embodiments include any of the noble metals combined with any 4d or 5d transition metal impurity. For example, such noble metals include gold, silver, platinum, ruthenium, rhodium, palladium, osmium, rhenium, and iridium. Other embodiments include materials similar to noble metals combined with any 4d or 5d transition metal impurity that are suitable for layer 230 because, for example, they exhibit spin dependent scattering and/or spin orbit interaction. The impurity may include one or more transition metals such as lutetium, Metal layer 230 couples to select switch (e.g., transistor) 220 via switching node 235. Switch 220 is enabled by WL 210. Switch 220 further couples to ground (GND) line 211. Bit write line 205 couples, directly or indirectly, to metal layer 230 via write node 237. Read line 204 couples, directly or indirectly, to magnet layer 225 via read node 236. Further, sense lines 206. 207 couple, directly or indirectly, to metal layer 230 via sense nodes 238, 238'. As described below, other embodiments exist that do not require separate lines for each of read, write, and sense lines (i.e., other embodiments allow one line to perform multiple functions).

Figure 2C:
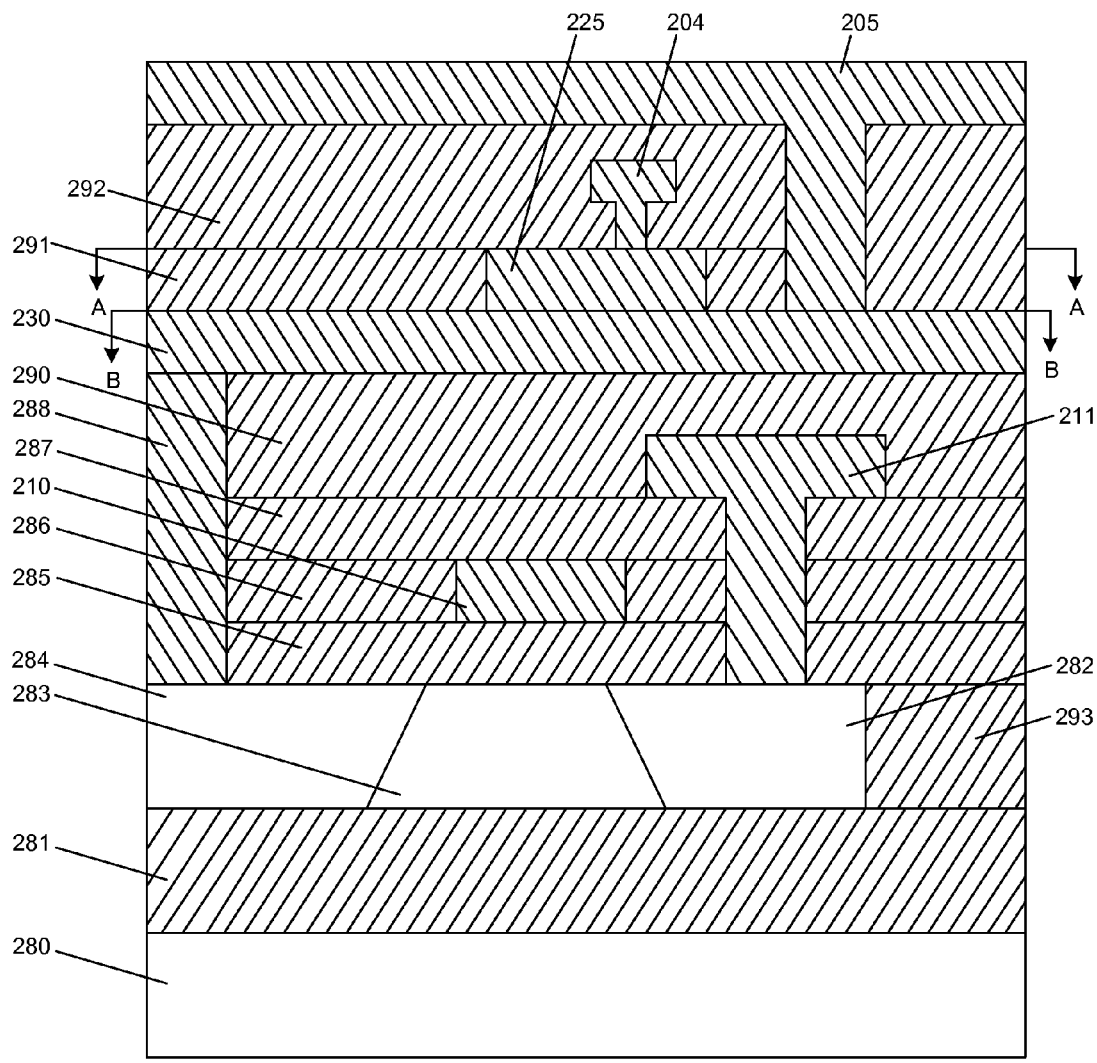

FIG. 2c shows a memory cell in an embodiment of the invention. Silicon oxide film 281 is an insulating film formed on silicon substrate 280 and below insulating film 293 (e.g., silicon nitride). Portions 282 (source/drain), 284 (drain/source) are doped silicon layer areas of opposite polarity to channel region 283. Gate electrode 210 is formed above the silicon layer of transistor regions 282, 283, 284 and is separated there from by gate insulating film 285 and separated from source line 211 and line 288 by dielectric film portions 286, 287. Source line 211 passes through layer 287 and is formed within dielectric layer 290. Line 288 couples transistor region 284 to high SHE metal layer 230. SHE metal layer 230 couples to dielectric layers 291, 290, magnet layer 225, BL write line 205 and sense lines 206, 207 (shown in FIG. 2d). In one embodiment layer 230 connects directly, without use of vias, to layer 225. Thus, in FIG. 2c layers 225, 230 are between metal layers for elements 205 and 211 but they may be between other metal layers in other embodiments (e.g., between layers for elements 288 and 210, between layers for elements 204, 206, 207 and the layer for element 205, and the like). Also, while transistor portions 282, 283, and 284 are representative of a switch and are not meant to limit embodiments to any particular type of transistor. For example, embodiments may include tri-gate and/or nanowire transistors and the like.

Figure 2D:
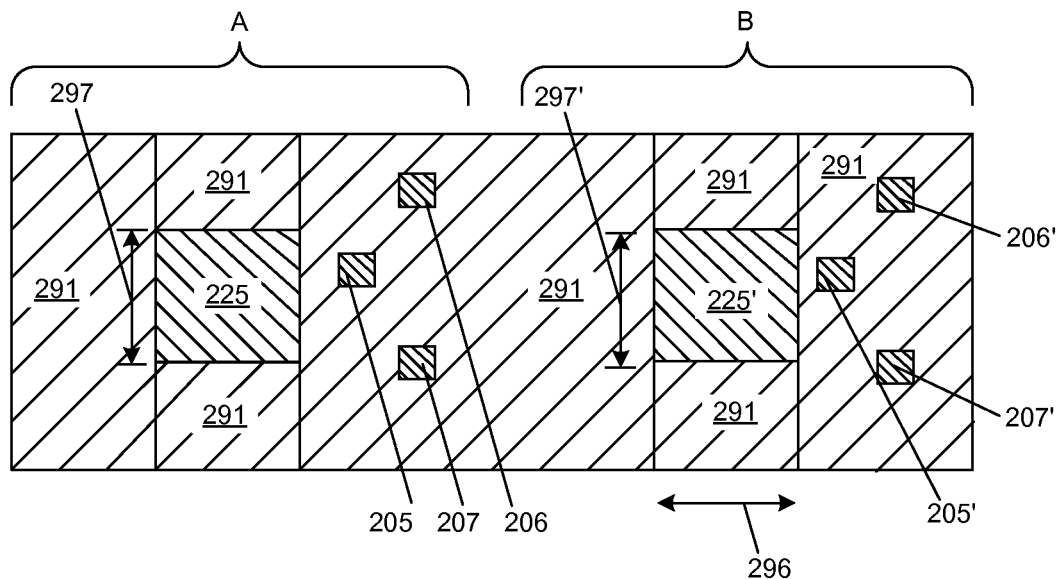
FIGS. 2d and 2e depict cross-section views of FIG. 2c in a multicell array.
Figure 2E:
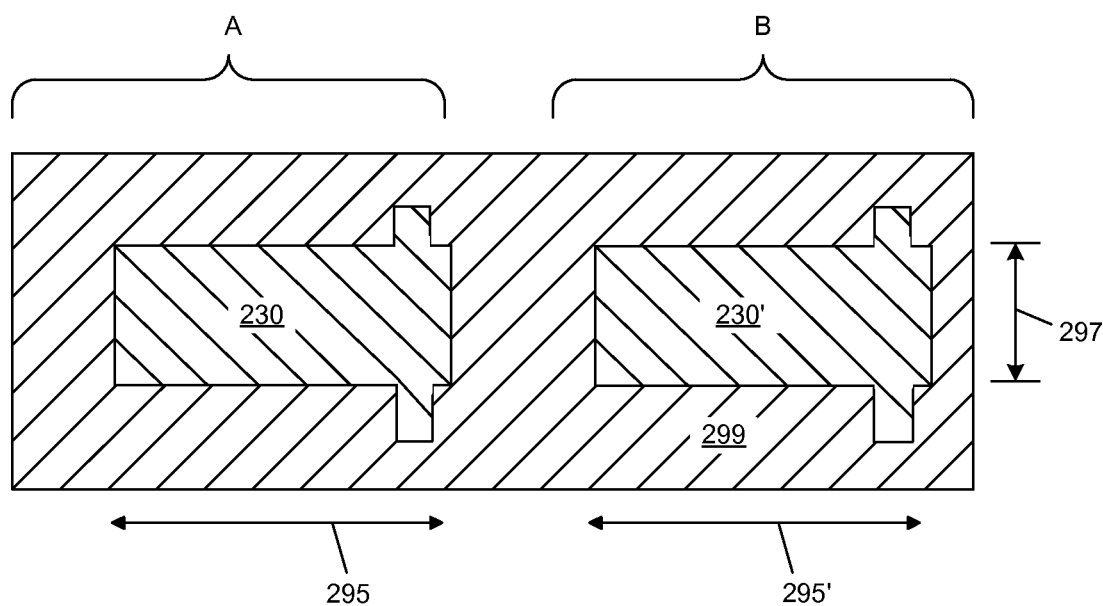

FIG. 2d includes a top view taken at section A-A of FIG. 2c and shows magnet layer 225 and sense lines 206, 207 that couple to extensions 240, 241 (see FIG. 2b). This includes a multiple cell array including cells A and B with elements for cell B hyphenated to show their analogous relationships to non-hyphenated elements of cell A. FIG. 2e includes a top view taken at section B-B of FIG. 2c and shows SHE metal layer 230 and dielectric layer 299. This includes a multiple cell array including cells A and B with elements for cell B hyphenated to show their analogous relationships to non-hyphenated elements of cell A. Other examples of multicell arrays are discussed below (e.g., FIGS. 5a, b, and c).

Regarding FIGS. 2a, 2b, 2d, and 2e and the dimensions of magnet layer 225 and SHE metal layer 230, in one embodiment thickness of metal layer 230 is decided based on the spin flip length of the metal chosen for layer 230 and magnet layer 225 is made thick enough to ensure good retention for data storage. In one embodiment thickness for magnet layer 225 (shown in the vertical direction of FIGS. 2a and 2c but not shown in FIG. 2b) may be approximately 3 nm and thickness for SHE metal layer 230 may be approximately 10 nm. However, other embodiments include thickness for magnet layer 225 being approximately 1, 2, 4, 5, 6 nm or more and thickness for SHE metal layer 230 being approximately 5, 6, 7, 8, 9, 11, 12, 13, 14, 15, 16, 17, 18, 19, 20 nm or more.

In one embodiment length 296 for magnet layer 225 may be approximately half or one quarter of length 295 for SHE metal layer 230. Length 296 for magnet layer 225 may be approximately 50 nm and width 297 may be approximately 100 nm. In another embodiment length 295 is about 104 nm, length 296 is about 26 nm, and width 297 is about 52 nm. However, in another embodiment length 296 may be approximately 10, 20, 40, 60, 80, 100, 120, 140, 160, 180 nm or more, length 295 may be 50, 60, 70, 80, 120, 140, 160, 180 nm or more, and width 297 may be approximately 30, 40, 75, 150 nm or more. Also, $R_{SHE}=2\rho a/bt$, where $R_{SHE}$ is resistance for SHE metal layer 230, $\rho$ is electrical resistivity, a is half of dimension 296, b is half of dimension 297, and t is thickness of layer 230. In one embodiment, b is at least twice the value of a. To obtain the desired resistance level for layer 230 in one embodiment dimension 295 is about twice that of dimension 297. In an embodiment dimension 295 is about four times that of dimension 296. In an embodiment dimension 297 is about twice that of dimension 296. Other embodiments are not so limited.

While magnet layer 225 appears rectangular in FIG. 2b in other embodiments it may be ovular or take on other shapes with rounded portions, and the like. Also, in FIG. 2b magnet layer 225 appears centered along length 295 of SHE metal layer 230, but in other embodiments magnet layer 225 may be lateral (left or right) of the midpoint for length 295. Also, while in one embodiment width 297 is the same for each of layers 225, 230 in other embodiments layer 225 may be wider or less wide than layer 230.

Figure 3A:
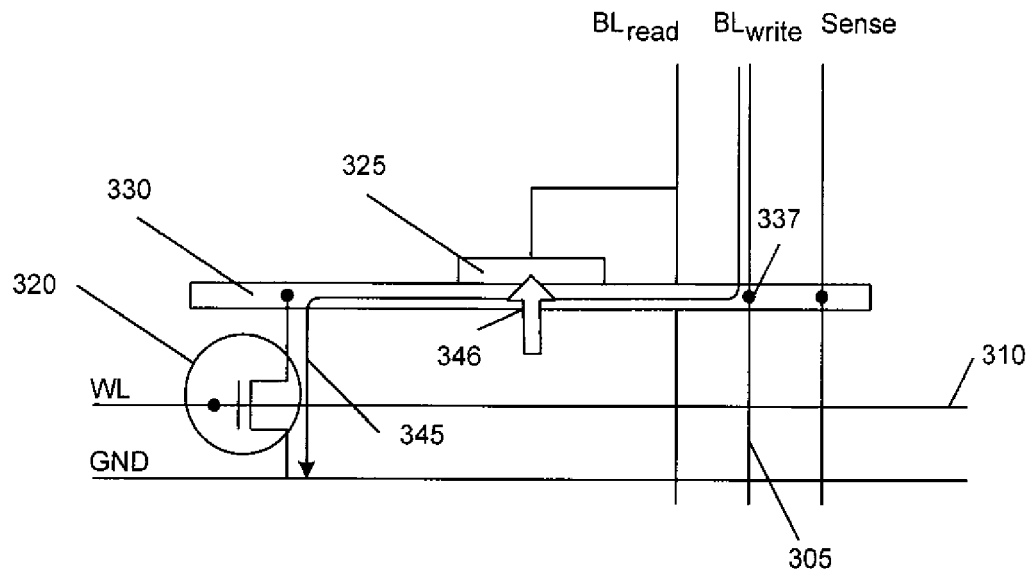
FIGS. 3a and 3b depict a write operation in an embodiment of the invention.
Figure 3B:
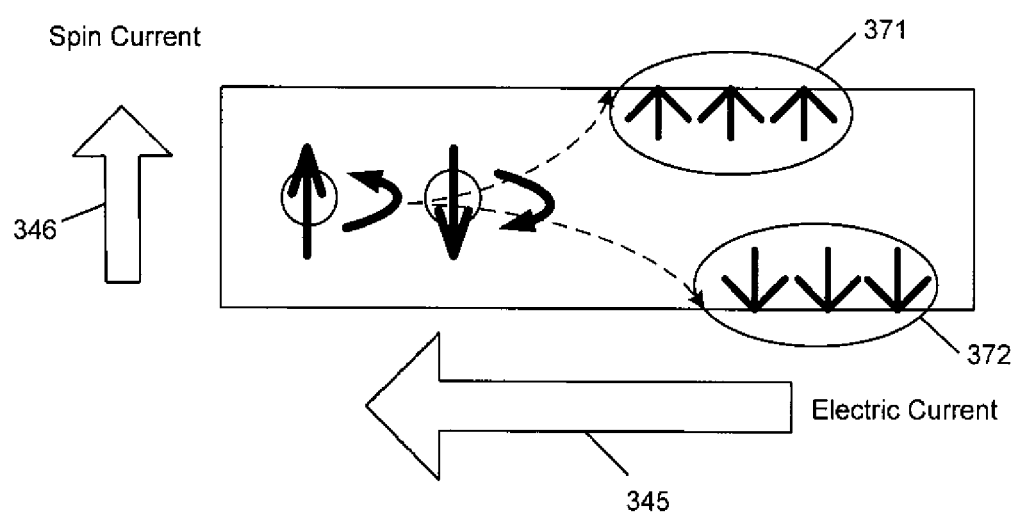

FIGS. 3a and 3b depict a write operation in an embodiment of the invention. A write operation includes injecting electrical charge current 345 from BL write line 305 to node 337 and then into metal layer 330 with a current path provided via WL 310 enabled transistor 320. As a result spin current 346 is generated, via SHE, in metal layer 330 and absorbed by magnet layer 325. Spin torque is generated in magnet layer 325 to switch the magnet. The mechanism for spin torque switching of magnet layer 325 is described in FIG. 3b. As charge current 345, which comprises electrons with up spins and other electrons with down spins, propagates through metal layer 330 lateral spin currents, such as later spin current 346, are generated due to spin dependent scattering processes in metal 330. Thus, during a write operation charge current 345 is supplied to metal layer 330 and induces spin current 346 and a magnetic state (e.g., a 0, 1, or additional memory state included in memories having more than two memory states) within magnet layer 325.

In one embodiment, spin current includes electrons having a first spin (see, e.g., electrons spinning up as depicted by arrow 371) along a first side of the metal layer and electrons having a second spin (see, e.g., electrons spinning down depicted by arrow 372), opposite the first spin, along a second side of the metal layer opposite the first side. Spin current 346 may be produced due to the electrons corresponding to arrows 371. Spin current is 346 is orthogonal to charge current 345.

The spin current density for current 346 is related to the charge current density for current 345 via spin Hall angle:

$$\alpha_{SHE} = \frac{\sigma_{szy}}{\sigma_{sxx}} = \frac{J_{sz}}{J_{sy}} \approx 0.1$$

Where $\alpha_{SHE}$ is spin Hall angle, $\sigma_{szy}$ is spin Hall conductivity, $\sigma_{sxx}$ is conductivity for metal 330, $J_{sz}$ is spin current 346 density, and $J_{sy}$ is charge current 345 density. The spin current injected into the magnet layer is given by:

$$\frac{I_s}{I_e} = \frac{J_{ss}A}{J_{ey}a} = a\frac{L}{d} \gg 1$$

where $I_s$ is spin current 346, $I_e$ is charge current 345, A is the surface area of the location where magnet layer 325 interfaces metal layer 330, a is the cross sectional area of metal layer 330 taken orthogonal to current 345, L is the length of the magnet layer, and d is the thickness of the metal layer. Thus, a larger spin current exists for a larger charge current passing through the metal. In other words, magnet layer 325 interfaces metal layer 330 via a location having a first surface area. Based on FIG. 2b this location may be rectangular in shape but other embodiments are not so limited. For example, other shapes include circular, ovular, and square interfaces. In an embodiment, magnet layer 325 directly interfaces metal layer 330. Metal layer 330 further has a cross sectional area perpendicular to the direction of current 345. The spin current amperage is proportional to the surface area of the magnet/metal interface and inversely proportional to the cross sectional area of the metal layer.

Figure 4A:
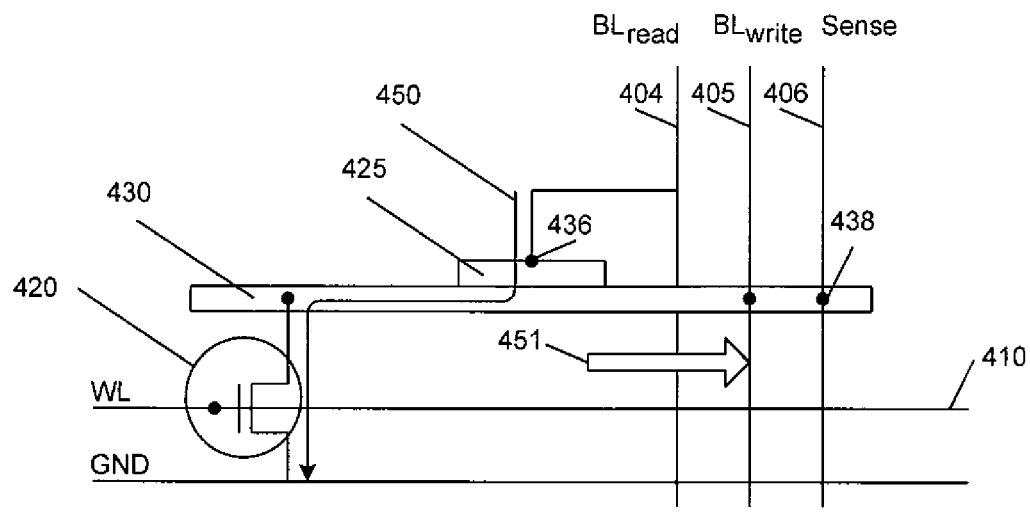
FIGS. 4a and 4b depict a read operation in an embodiment of the invention.
Figure 4B:
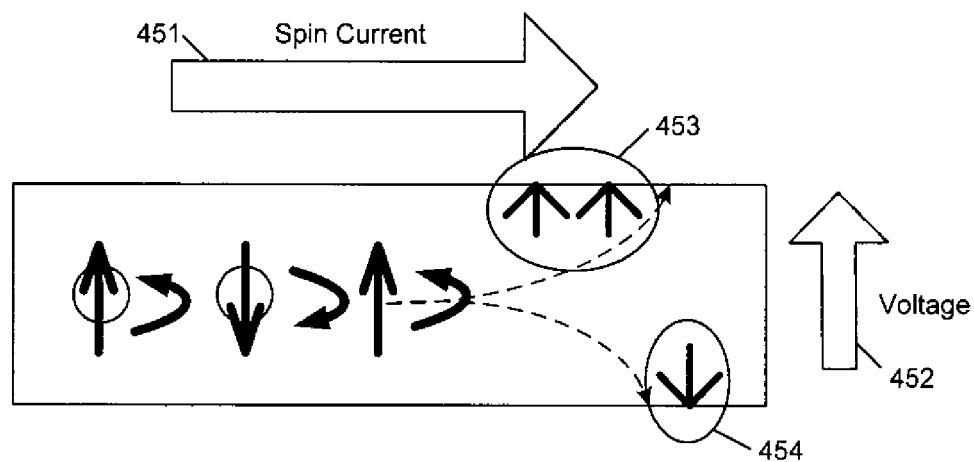

FIGS. 4a and 4b depict a read operation in an embodiment of the invention. The read operation of one embodiment works as follows. Spin polarized current 450 (read current) is injected into metal layer 430 via magnet layer 425 from node 436 and BLread line 404. Current 450 is spin polarized considering it includes spin polarized current comprising a first portion of spin current having a first spin orientation (e.g., up) and a second portion of spin current having a second spin orientation (e.g., down) that is opposite the first spin orientation. The first portion is unequal to the second portion such that, for example, there are more up spinning electrons than down spinning electrons. This spin polarization of current 450 is determined by the direction of magnetization of magnet layer 425. Pure spin current 451 flows from underneath the magnet towards sense nodes 438, 438' (not shown) of metal 430. Pure spin current is current that can exist without being accompanied by charge current (i.e., pure spin current can exist by itself). Voltage 452 (see voltage 252 of FIG. 2b) is induced across sense nodes 438, 438' (see nodes 238, 238' of FIG. 2b) due to ISHE. The polarity of voltage 452 is determined by the direction of magnetization (magnet state) of magnet layer 425.

FIG. 4b shows multiple arrows 453 indicating a large number of up spinning electrons. Single arrow 454 indicates a relatively smaller number of down spinning electrons. This differential in charge leads to voltage 452, with its magnitude and polarity based on the differential. In other words, the polarity and magnitude of voltage 452 are both based on the first portion (e.g., electrons 453) being unequal to the second portion (e.g., electrons 454).

Referring back to FIG. 2b, in one embodiment of the invention (but not all embodiments) metal layer 230 includes one or more orthogonal metal extensions 240, 241 on the end of layer 230 furthest away from select transistor 220. Nodes 238, 238' are located respectively on extensions 240, 241 to sense ISHE voltage 452. Thus, in one embodiment metal layer 230 includes an extension that (a) comprises a sense node (e.g., 238 or 238'), (b) projects outwards from the metal layer, and (c) is orthogonal to the metal layer. "Orthogonal" is to be interpreted in the real world sense to include generally projecting outwards at or near 90 degrees (but not absolutely 90 degrees). The orthogonal nature aligns the sensing node with voltage 452 (and its corresponding field) generated based on the differential between oppositely spinning electrodes 453, 454. In other embodiments, nodes 238, 238' may be located on layer 230 when no extensions 240, 241 exist. In various embodiments extensions 240, 241 extend 5, 10, 15, 20, or 25 nm away (or much further including 50, 100, 200 nm or more) from the main portion of layer 230 (see dimensions 298, 299 of FIG. 2b). One extension may extend further away from the main portion of layer 230 than the other extension. However, in another embodiment they extend equal distances away from the main portion of layer 230. They may be 600 nm wide (the dimension orthogonal to dimensions 298, 299) and 300 nm thick in various embodiments. In other embodiments the extensions may be 100, 200, 300, 400, 500, 700, 800 nm wide or more and the thickness may be 100, 200, 400 nm or more. The thickness may not necessarily be equal to the thickness of layer 230 but may indeed be approximately the same thickness. The extensions need not be rectangular and may instead be square or include rounded edges and the like.

Thus, read current 450 includes spin polarized current having a spin orientation based on the magnetic state within magnet layer 425; and charge current 345 has no predominant spin orientation. For a read operation spin current 451, within metal layer 430, generates an electric field and corresponding voltage 452, based on ISPE, at sense nodes 238, 238' coupled to metal layer 430. The polarity of voltage 452 is determined based on the magnetic state within the magnet layer 425.

Electric field $E_{ISHE}$, generated by spin current 451 due to ISHE, can be written as:

$$E_{ISHE} = \alpha_{SHE}\rho_N(j_s \times \hat{\sigma})$$

Where $\alpha_{SHE}$ is the spin Hall angle (e.g., ~0.1 for metal layers composed of platinum, 0.15 for metal layers composed of tantalum), $\rho_N$ is electrical resistivity, $j_s$ is spin current density and $\hat{\sigma}$ is the direction of the spin polarization. The net voltage between nodes 238, 238' can be obtained by:

$$V_{ISHE} = W_s \alpha_{SHE} \rho_N (j_s \times \hat{\sigma})$$

where $W_s$ is the width between nodes 238, 238'. Thus, while some embodiments may not include projections 240, 241 others may include the projections to increase $W_s$ and make voltage/state sensing easier based on generating a larger $V_{ISHE}$.

Figure 5A:
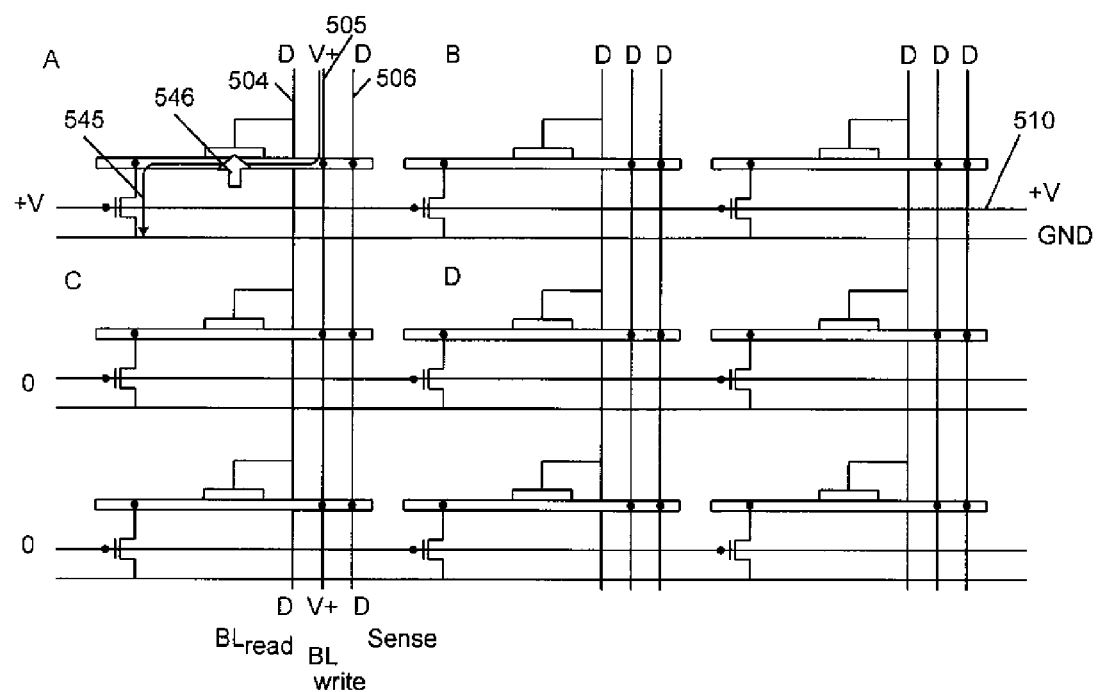
Figure 5B:
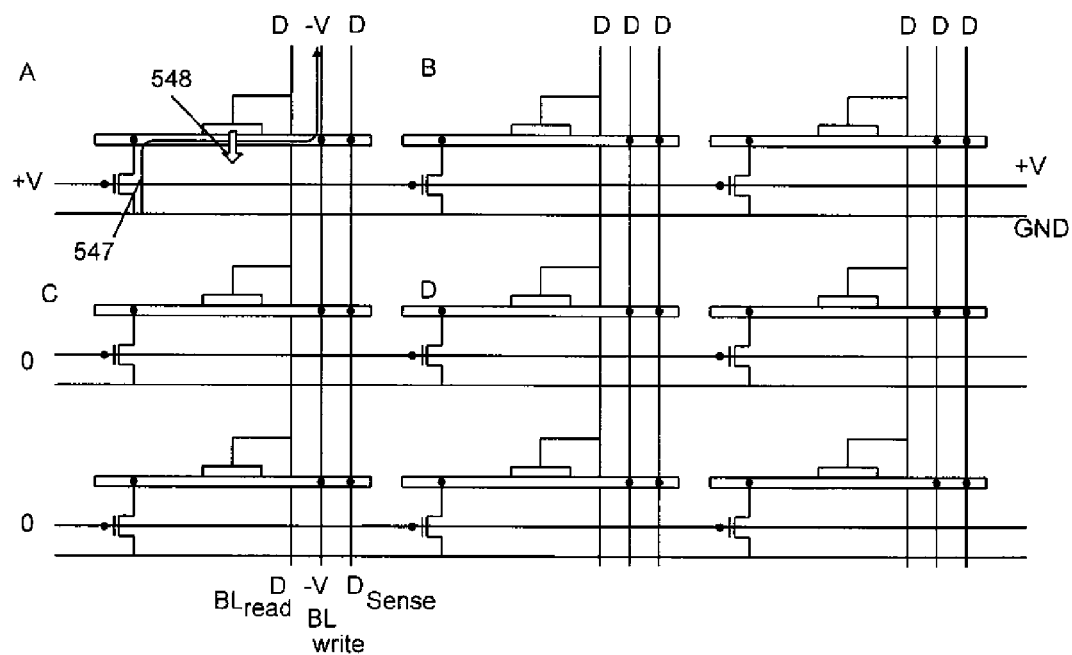

FIGS. 5a, 5b, and 5c depict write operations in an embodiment of the invention. The array includes one WL along each of the rows (to enable/disable the selection transistor) and two bit lines (e.g., lines 504, 505) along the columns (to perform reading and writing). A third vertical line (e.g., line 506) provides the high resistive readout of the spin Hall voltage from the memory cells.

FIG. 5a addresses writing a 1 to memory cell "A" and FIG. 5b addresses writing a 0 to memory cell A. A write operation can be performed on the array by enabling $BL_{write}$ 505 and WL 510 for the appropriate cell. The charge current direction can be inverted by applying +V (charge current 545 resulting in spin current 546 in FIG. 5a) or −V (charge current 547 resulting in spin current 548 in FIG. 5b) to the $BL_{write}$ column. FIG. 5c includes element bias conditions for the write operation for each of cells A, B, C, D of FIGS. 5a and 5b. Thus, as the charge current polarity changes so too does spin current polarity, which can induce a switch in magnetic states (e.g., from 0 to 1 and vice versa) for the memory cell.

Figures 6A, 6B:
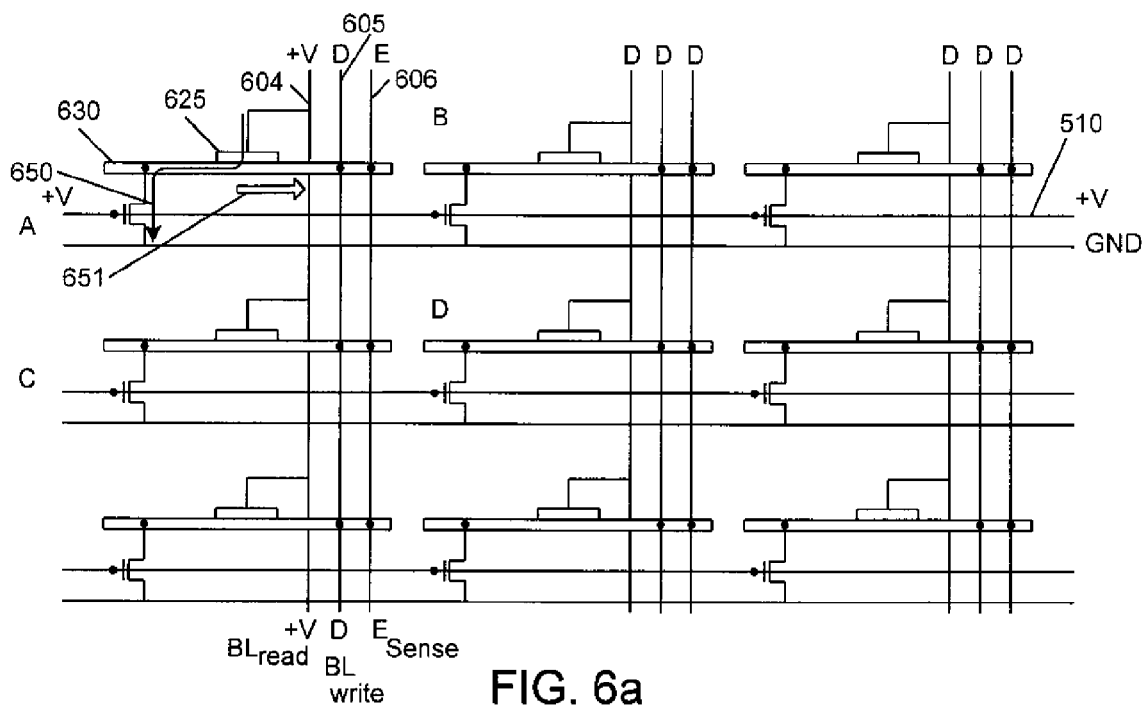
FIGS. 6a and 6b depict a read operation in an embodiment of the invention.

FIGS. 6a and 6b depict a read operation in an embodiment of the invention. Again, read current 650 is supplied via line 604 to magnet layer 625 and then metal layer 630. Doing so produces spin current 651 that is sensed via line 606. FIG. 6b includes element bias conditions for the read operation for each of cells A, B, C, and D of FIG. 6a.

Figure 7A:
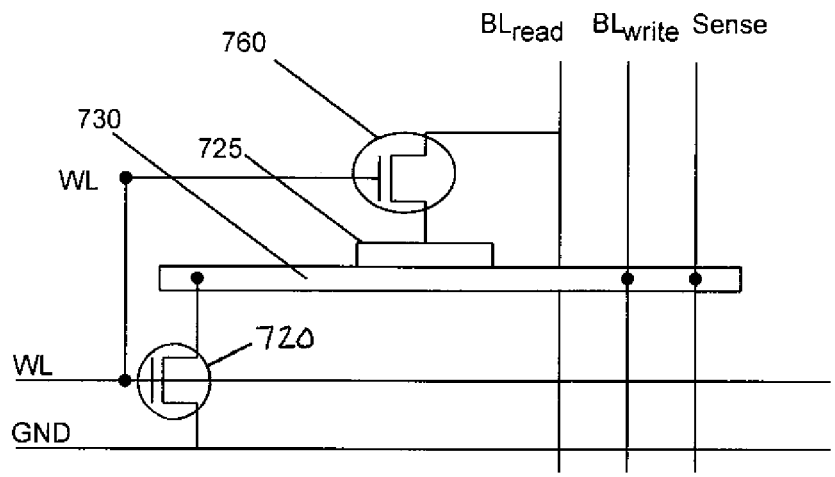
FIGS. 7a, 7b, and 7c depict views of a memory cell in an embodiment of the invention.
Figure 7B:
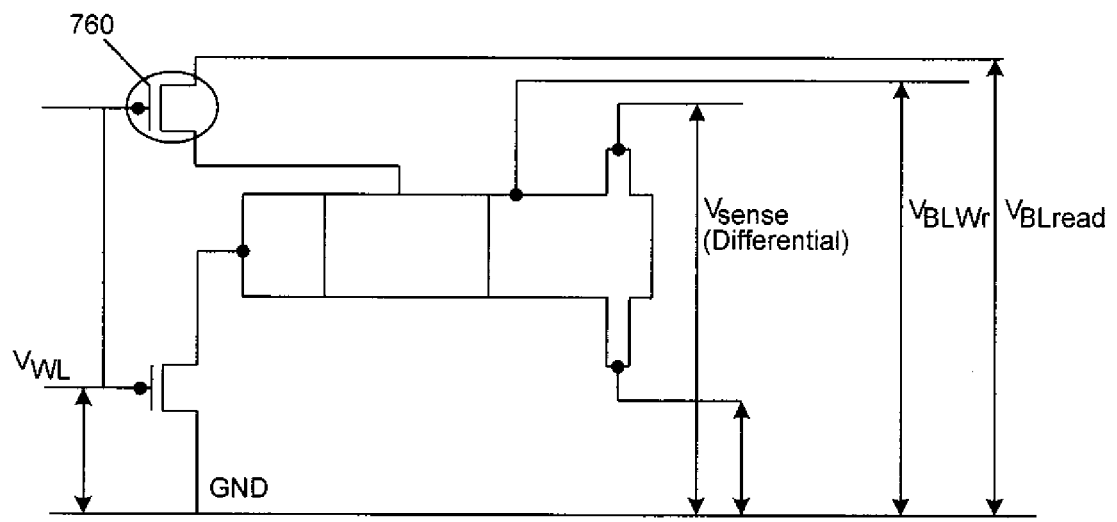
Figure 7C:
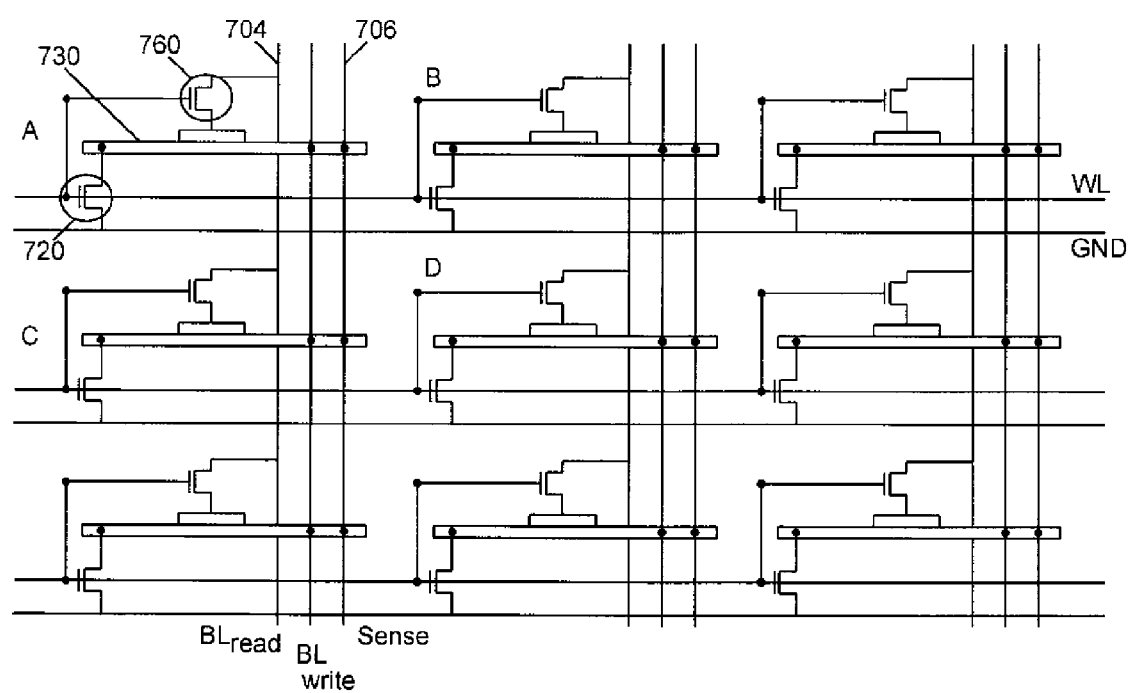

FIGS. 7a, 7b, and 7c depict different views of a memory cell in an embodiment of the invention. Such an embodiment helps guard against "disturb" issues possible for cell C. For example, if the impedance through sense line 706 (coupling cells C and A) is low then line 706 may form a path to WL transistor 720 of cell A. Specifically, during a read operation of cell A line 706 is enabled so spin current in metal 730 may loop from cell A to cell C via active line 706. Because line 704 is also active the current may continue its loop through the metal and magnet layers of cell C to cell A via line 704. To prevent this loop switch (e.g., transistor) 760 may be included in the cell. Switch 760 is then inactive (based on the WL cell C being inactive) in cell C when cell A is being read, thereby terminating the loop.

Thus, a read disturb such as the one above may occur if two conditions are satisfied: (1) the read current through the disturbed cell (C) causes a spin torque due to secondary spin torque effects originating from SHE (which are based on the injected current turning from out of plane to in plane), and (2) impedance of sense line 706 connecting the cells A and C along the column is low enough to cause a current path from cell C to cell A. This read disturb possibility is avoided/diminished via transistor 760, which connects BLread 704 to magnet 725 to enable the BLread path selectively. Having two transistors per cell may pose little problem for the area of memory cells considering the size of such cells may be limited by the size of the magnetic elements and their related contacts (rather than by contacts to transistors).

Figures 8A, 8B:
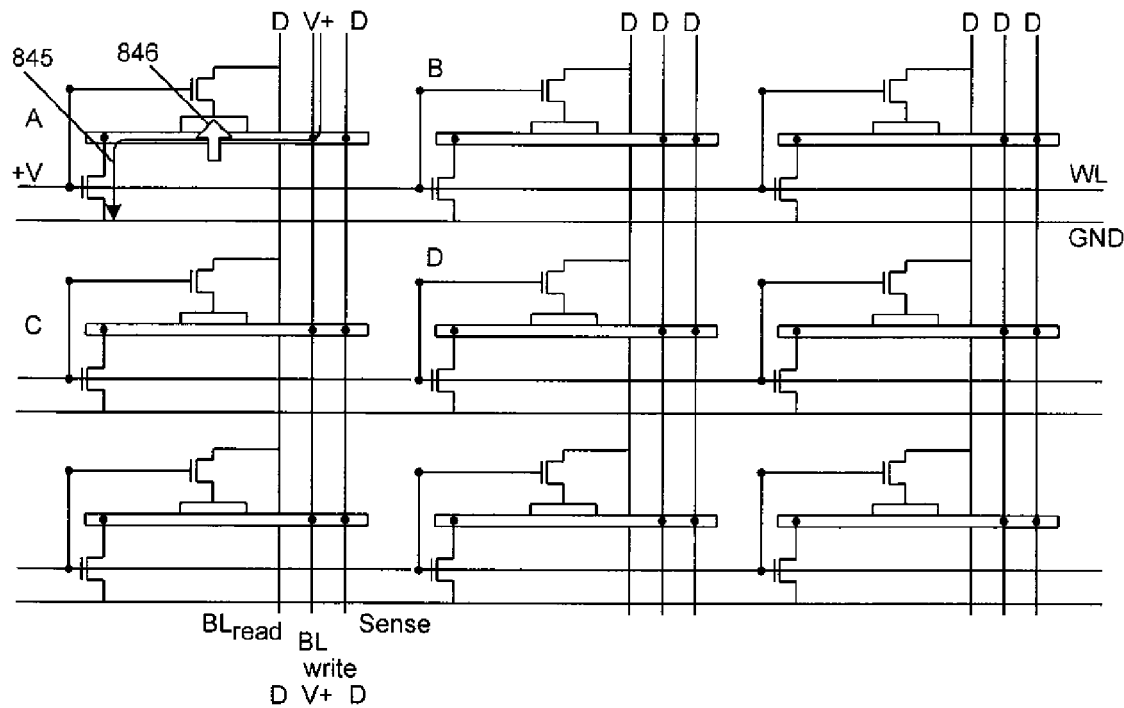
FIGS. 8a and 8b depict a write operation in an embodiment of the invention.
Figures 9A, 9B:
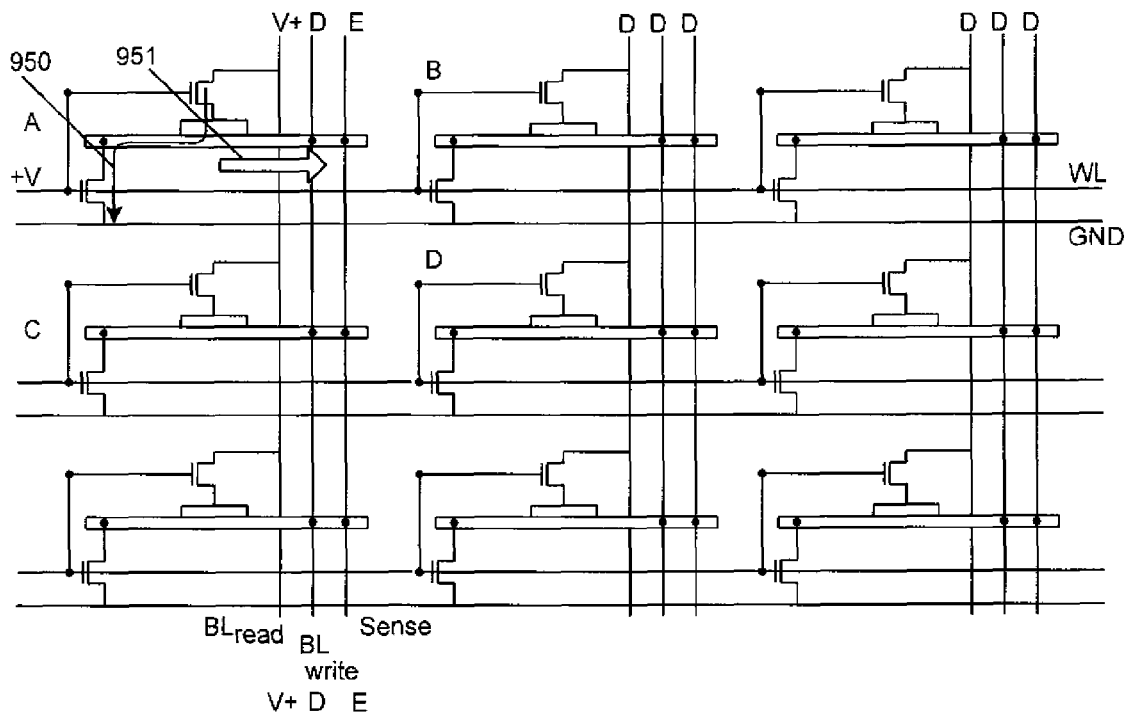
FIGS. 9a and 9b depict a read operation in an embodiment of the invention.

FIGS. 8a and 8b depict a write operation in an embodiment of the invention. FIG. 8a depicts a write operation via spin current 846 and charge current 845. FIG. 8b includes element bias conditions for the write operation for each of cells A, B, C, and D of FIG. 8a. FIGS. 9a and 9b depict a read operation in an embodiment of the invention. FIG. 9a depicts a read operation via read current 950 and spin current 951. FIG. 9b includes element bias conditions for the write operation for each of cells A, B, C, and D of FIG. 9a.

Figure 10:
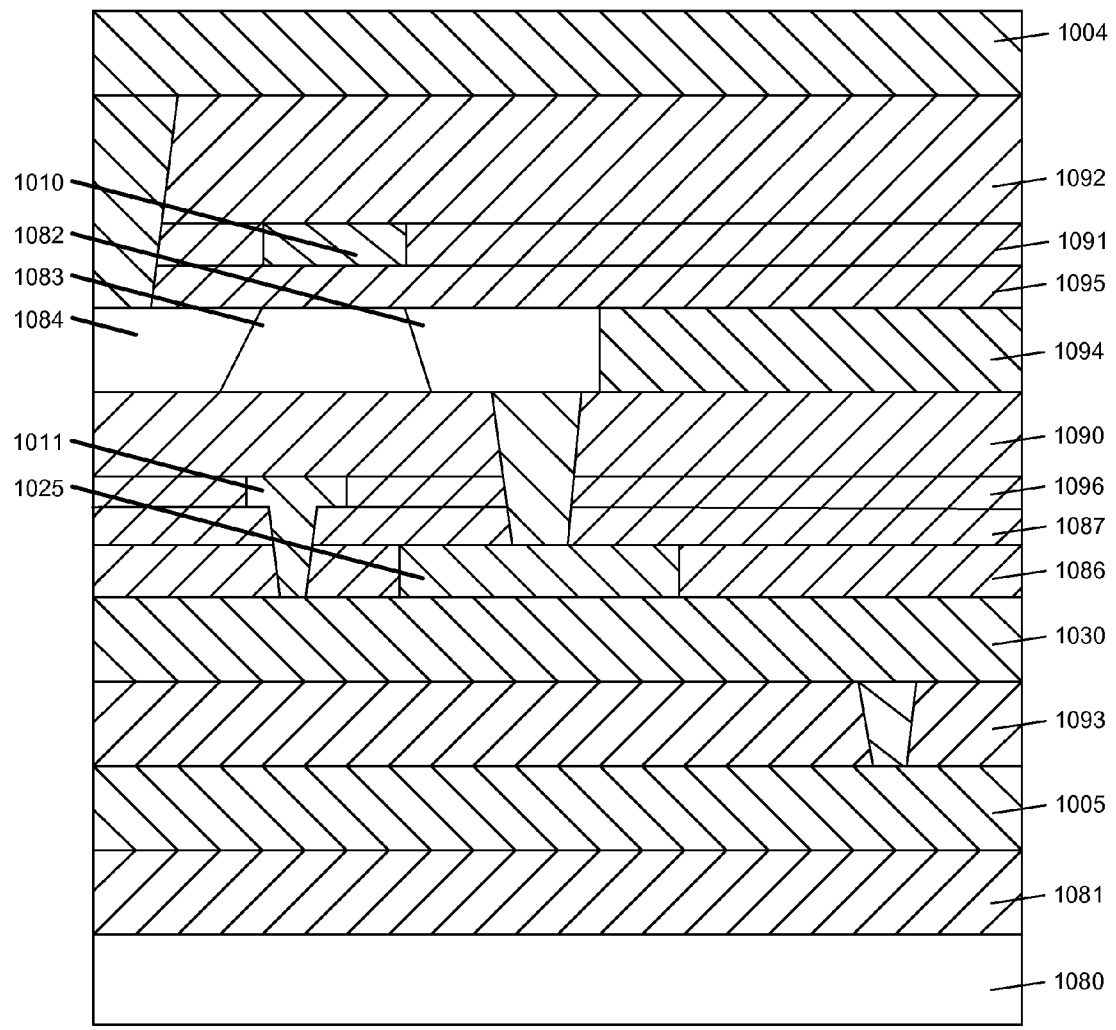
FIG. 10 includes a cross sectional view of a memory cell in an embodiment of the invention.

In another embodiment a cell similar to FIG. 7a is used only in this embodiment switch device 720 (coupling metal layer 730 to GND) is omitted and replaced with a line coupling metal layer 730 to a select line (SL). Such a line would not interface WL. The remainder of the embodiment is similar to the embodiment of FIG. 7a albeit with the switching accomplished by element 720 now handled with other switch logic coupled to SL. FIG. 10 includes cross section of such an embodiment. BL read 1004 couples (using a via) to a source/drain 1084, which is part of a switching device including channel 1083 and drain/source 1082. Drain/source 1082 couples (using a via) to magnet layer 1025, which directly connects to metal layer 1030. Gate 1010 couples to a write line (WL). Layer 1030 couples (using a via) to line that couples to a select line (SL). SHE metal layer 1030 also couples (using a via) to BL write 1005 and sense line 1011. Sense lines coupling to extensions of metal layer 1030 are not visible in this view. Silicon oxide film 1081 is an insulating film formed on silicon substrate 1080. Dielectric/insulation layers 1093, 1086, 1087, 1096, 1090, 1094, 1093, 1095, 1091 (gate insulating film), and 1092 are also included.

As seen in FIG. 2a, for example, magnet layer 225 couples to metal layer 230 at a location between the switching node 235 and sense nodes 238, 238'. Spreading nodes 238, 238' away from node 235 helps distinguish current 451 from being masked by current 450 (i.e., helps increase signal-to-noise ratio (SNR)). The embodiment includes no magnetic tunnel junction and no other magnetic layer beyond the magnet layer. Due to the use of SHE and ISPE charge current and read current may be generated by a supply voltage of less than 0.3 volts, thereby providing an energy efficient memory cell.

As seen above, various embodiments include a memory cell that utilizes SHE to write to the memory and ISHE to sense the memory state. The SHE generates spin polarized currents, in certain metals with high spin orbit coupling from normal electrical currents. The ISHE generates voltage from a spin-polarized current, which is in turn determined by the magnetization of the memory element. In high spin orbit coupling metals (e.g., platinum, tantalum, gold and copper with certain impurities) a normal charge current generates a spin current due to spin dependent scattering processes. This effect is enhanced due to the generation of spin current across the entire cross-section of the magnet (see discussions regarding A and a for FIG. 3). While embodiments such as FIG. 2 includes separate lines for write and sense operations, in other embodiments these lines may be combined and shared, multiplexed, and the like. Furthermore, in an embodiment there is an interface layer between the magnet and metal layers.

Figure 11:
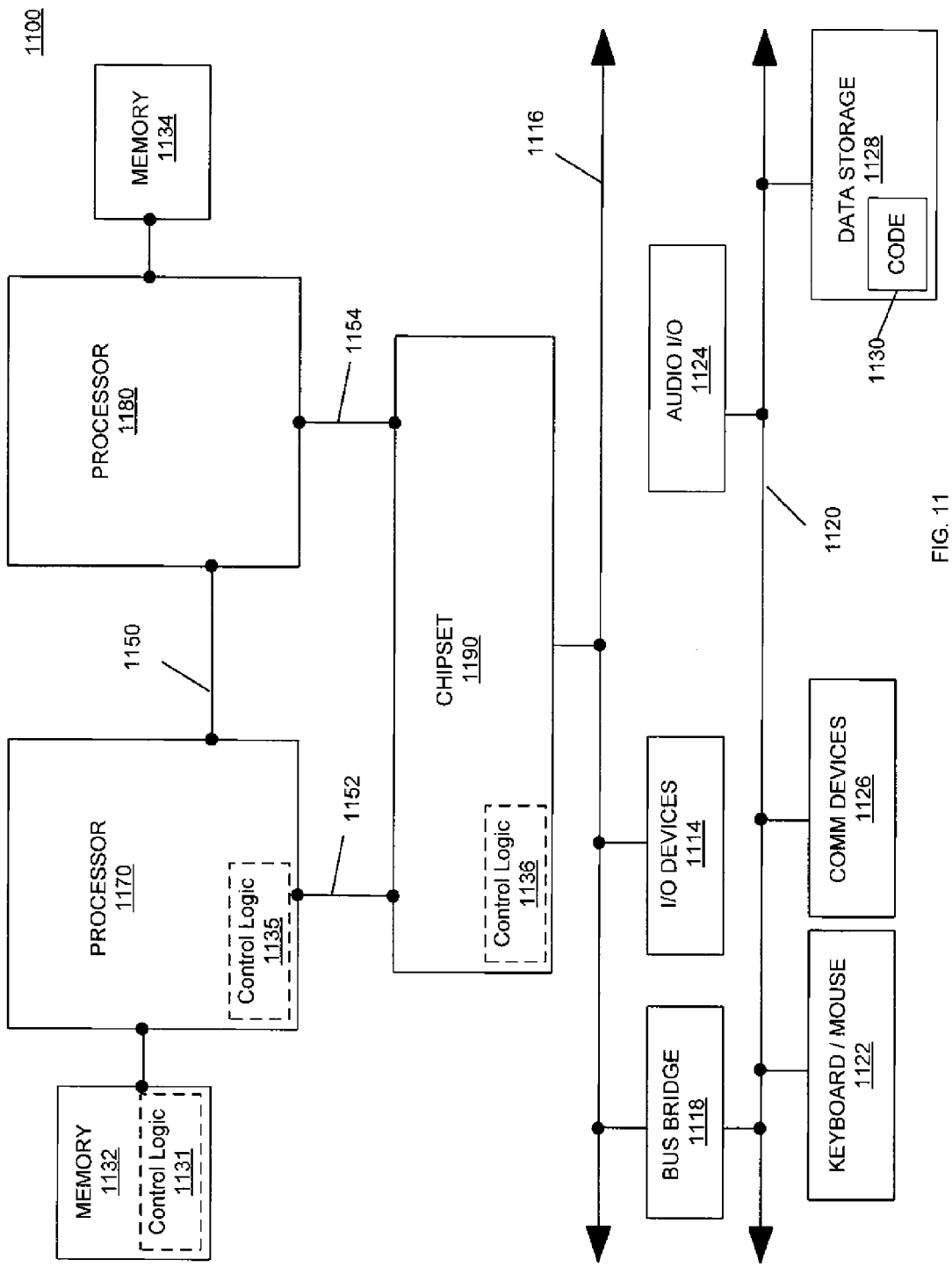
FIG. 11 includes a system with a memory cell of one embodiment of the invention.

Embodiments may be implemented in many different system types. Referring now to FIG. 11, shown is a block diagram of a system (e.g., cell phone, Smartphone, tablet, Ultrabook™, notebook, laptop, desktop, server, personal digital assistant, mobile computing device, and the like) in accordance with an embodiment of the present invention. Multiprocessor system 1100 is a point-to-point interconnect system, and includes a first processor 1170 and a second processor 1180 coupled via a point-to-point interconnect 1150. Each of processors 1170 and 1180 may be multicore processors. The term "processor" may refer to any device or portion of a device that processes electronic data from registers and/or memory to transform that electronic data into other electronic data that may be stored in registers and/or memory. First processor 1170 may include a memory controller hub (MCH) and point-to-point (P-P) interfaces. Similarly, second processor 1180 may include a MCH and P-P interfaces. The MCHs may couple the processors to respective memories, namely memory 1132 and memory 1134, which may be portions of main memory (e.g., a dynamic random access memory (DRAM)) locally attached to the respective processors. First processor 1170 and second processor 1180 may be coupled to a chipset 1190 via P-P interconnects, respectively. Chipset 1190 may include P-P interfaces. Furthermore, chipset 1190 may be coupled to a first bus 1116 via an interface. Various input/output (I/O) devices 1114 may be coupled to first bus 1116, along with a bus bridge 1118, which couples first bus 1116 to a second bus 1120. Various devices may be coupled to second bus 1120 including, for example, a keyboard/mouse 1122, communication devices 1126, and data storage unit 1128 such as a disk drive or other mass storage device, which may include code 1130, in one embodiment. Code may be included in one or more memories including memory 1128, 1132, 1134, memory coupled to system 1100 via a network, and the like. Further, an audio I/O 1124 may be coupled to second bus 1120. Embodiments of the memory described herein may be found in memories 1132, 1134, and 1128, within processor 1170, 1180, chipset 1190, and the like.

Embodiments may be implemented in code and may be stored on storage medium having stored thereon instructions which can be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

Embodiments of the invention may be described herein with reference to data such as instructions, functions, procedures, data structures, application programs, configuration settings, code, and the like. When the data is accessed by a machine, the machine may respond by performing tasks, defining abstract data types, establishing low-level hardware contexts, and/or performing other operations, as described in greater detail herein. The data may be stored in volatile and/or non-volatile data storage. The terms "code" or "program" cover a broad range of components and constructs, including applications, drivers, processes, routines, methods, modules, and subprograms and may refer to any collection of instructions which, when executed by a processing system, performs a desired operation or operations. In addition, alternative embodiments may include processes that use fewer than all of the disclosed operations, processes that use additional operations, processes that use the same operations in a different sequence, and processes in which the individual operations disclosed herein are combined, subdivided, or otherwise altered. In one embodiment, use of the term control logic includes hardware, such as transistors, registers, or other hardware, such as programmable logic devices (1135). However, in another embodiment, logic also includes software or code (1131). Such logic may be integrated with hardware, such as firmware or micro-code (1136). A processor or controller may include control logic intended to represent any of a wide variety of control logic known in the art and, as such, may well be implemented as a microprocessor, a micro-controller, a field-programmable gate array (FPGA), application specific integrated circuit (ASIC), programmable logic device (PLD) and the like.

An embodiment includes a memory cell comprising: a magnet layer coupled to a metal layer; a word line coupled to the metal layer via a switching element and a switching node; a write line connected to the metal layer via a write node; and a read line connected to the magnet layer via a read node; wherein during a write operation charge current is supplied to the metal layer via the write line and induces spin current and a magnetic state within the magnet layer. In an embodiment during an additional write operation additional charge current is supplied to the metal layer via the write line and induces additional spin current within the magnet layer and a switch to an additional magnetic state within the magnet layer, the charge and spin currents respectively having opposite polarities of the additional charge and spin currents; and the magnetic state is unequal to the additional magnetic state. In an embodiment during the write operation the charge current induces the spin current and the magnetic state based on Spin Hall Effect (SHE). In an embodiment the spin current includes electrons having a first spin along a first side of the metal layer and electrons having a second spin, opposite the first spin, along a second side of the metal layer opposite the first side; the spin current is orthogonal to the charge current; and the magnetic state is based on Spin Hall Effect (SHE). In an embodiment during a read operation read current is supplied, via the read line, to the magnet layer and then to the metal layer and induces another spin current, within the metal layer, that generates an electric field and corresponding voltage, based on Inverse Spin Hall Effect (ISPE), at a sense node coupled to the metal layer. In an embodiment a polarity of the voltage is determined based on the magnetic state within the magnet layer. In an embodiment during the read operation the read current is supplied, via the read line, to the magnet layer and then to the metal layer and induces the another spin current. In an embodiment the read current includes spin polarized current having a spin orientation based on the magnetic state within the magnet layer; and the charge current has no predominant spin orientation. In an embodiment the read current includes spin polarized current comprising a first portion of spin current having a first spin orientation and a second portion of spin current having a second spin orientation that is opposite the first spin orientation; the first portion is unequal to the second portion; and a polarity and a magnitude of the voltage are both based on the first portion being unequal to the second portion. In an embodiment the sense node electrically couples to one of the write line and a sense line included in the memory cell. In an embodiment the magnet layer couples to the metal layer at a location between the switching and sense nodes. In an embodiment the metal layer includes an extension that (a) comprises the sense node, (b) projects outwards from the metal layer, and (c) is orthogonal to the metal layer. In an embodiment the cell includes no magnetic tunnel junction and no other magnetic layer beyond the magnet layer. In an embodiment the charge current is generated by a supply voltage of less than 0.3 volts. In an embodiment the magnet layer interfaces the metal layer via a location having a first surface area; during the write operation the charge current flows throw the metal layer in a first direction; the metal layer has a first cross section area perpendicular to the first direction; and the spin current amperage is proportional to the first surface area and inversely proportional to the first cross section area. An embodiment includes an additional switching element coupled between the magnet layer and the read node. In an embodiment the magnet layer includes a magnet comprising at least one of nickel, cobalt, iron, and Huesler alloy and the metal layer includes a spin orbit coupling material comprising at least one of platinum, tantalum, copper, and gold. An embodiment includes a mobile computing apparatus comprising at least one processor coupled to the memory cell as described above.

An embodiment includes a memory including a magnet layer coupled to a metal layer, a word line coupled to the metal layer via a switching element and a switching node; a write line connected to the metal layer via a write node; and a read line connected to the magnet layer via a read node; and at least one processor, coupled to the memory, to perform operations comprising a write operation wherein charge current is supplied to the metal layer via the write line and induces spin current and a magnetic state within the magnet layer. In an embodiment the spin current includes electrons having a first spin along a first side of the metal layer and electrons having a second spin, opposite the first spin, along a second side of the metal layer opposite the first side; and the spin current is orthogonal to the charge current. In an embodiment the operations comprise a read operation wherein read current is supplied, via the read line, to the magnet layer and then to the metal layer and induces another spin current, within the metal layer, that generates an electric field and corresponding voltage, based on ISPE, at a sense node coupled to the metal layer. In an embodiment a polarity of the voltage is determined based on the magnetic state within the magnet layer. In an embodiment the read current includes spin polarized current having a spin orientation based on the magnetic state within the magnet layer; and the charge current has no predominant spin orientation. In an embodiment the magnet layer interfaces the metal layer via a location having a first surface area; during the write operation the charge current flows throw the metal layer in a first direction; the metal layer has a first cross section area perpendicular to the first direction; and the spin current amperage is proportional to the first surface area and inversely proportional to the first cross section area.

An embodiment includes a memory cell comprising: a substrate; a metal layer on the substrate; and a ferromagnetic layer directly contacting the metal layer; wherein there is not a second ferromagnetic layer directly contacting the metal layer. In an embodiment the metal layer has a metal layer thickness, a metal layer length, and a metal layer width, the ferromagnetic layer has a ferromagnetic layer thickness, a ferromagnetic layer length, and a ferromagnetic layer width that is longer than the ferromagnetic layer length, and the ferromagnetic layer length is shorter than the metal layer length. In an embodiment the metal layer width is shorter than the metal layer length. In an embodiment the ferromagnetic layer width is generally equal to the metal layer width. In an embodiment the ferromagnetic layer width is less than the metal layer width. In an embodiment the metal layer width has a first lateral boundary and a second lateral boundary, and the ferromagnetic layer extends beyond the first lateral boundary and does not extend beyond the second lateral boundary. In an embodiment the ferromagnetic layer thickness is no greater than 5 nm, the metal layer thickness is no less than 5 nm, and the ferromagnetic layer width is no less than 25 nm. In an embodiment the metal layer comprises at least one noble metal and at least one 5 d transition metal. In an embodiment the noble metal is at least one of platinum, copper, silver, and gold and the 5 d transition metal is at least one of lutetium, hafnium, tantalum, tungsten, rhenium, osmium, iridium, and mercury. In an embodiment the ferromagnetic layer includes at least one of nickel, cobalt, iron, and Huesler alloy. In an embodiment the metal layer comprises at least one noble metal and at least one 4 d transition metal, the noble metal includes at least one of platinum, tantalum, copper, silver, and gold, and the 4 d transition metal includes at least one of yttrium, zirconium, niobium, molybdenum, technetium, ruthenium, rhodium, palladium, silver, and cadmium. An embodiment includes a select transistor on the substrate adjacent the metal layer, the select transistor having one of a source and a drain to electrically couple to the metal layer. An embodiment comprises a first contact connected to a first end of the metal layer, a second contact connected to a second end of the metal layer, a third contact connected to the second end of the metal layer, and a fourth contact connected to the ferromagnetic layer. In an embodiment the ferromagnetic layer is located between the first and second contacts. An embodiment comprises a first contact connected to a first end of the metal layer; a first extension, comprising a second contact, that projects outwards from the metal layer; and a second extension, comprising a third contact, that projects outwards from the metal layer; wherein the ferromagnetic layer is located between the first and second contacts. In an embodiment the first and second extensions are orthogonal to the metal layer, the second extension projects outwards from the metal layer in a direction opposite the first extension, and the metal layer and the first and second extensions are co-planar with one another. In an embodiment during a write operation charge current is supplied to the metal layer and induces spin current and a magnetic state within the magnet layer. In an embodiment during the write operation the charge current induces the spin current and the magnetic state based on Spin Hall Effect (SHE). In an embodiment the spin current is orthogonal to the charge current.

An embodiment includes a memory cell comprising: a substrate; a metal layer on the substrate; and a ferromagnetic layer on the metal layer; wherein there is no tunneling barrier between the metal and ferromagnetic layers and the metal layer comprises at least one noble metal and at least one transition metal. In an embodiment the metal layer has a metal layer thickness, a metal layer length, and a metal layer width, the ferromagnetic layer has a ferromagnetic layer thickness, a ferromagnetic layer length, and a ferromagnetic layer width that is longer than the ferromagnetic layer length, and the ferromagnetic layer length is shorter than the metal layer length. In an embodiment the metal layer width is shorter than the metal layer length. In an embodiment the ferromagnetic layer directly contacts the metal layer without using a via and the memory cell comprises a select transistor on the substrate having one of a source and a drain to electrically couple to the metal layer. An embodiment includes a first contact connected to a first end of the metal layer; a first extension, comprising a second contact, that projects outwards from the metal layer; and a second extension, comprising a third contact, that projects outwards from the metal layer; wherein the ferromagnetic layer is located between the first and second contacts. In an embodiment during a write operation charge current is supplied to the metal layer and induces spin current and a magnetic state within the magnet layer and the charge current induces the spin current and the magnetic state based on Spin Hall Effect (SHE). In an embodiment the spin current is orthogonal to the charge current.

An embodiment includes a substrate; a metal layer on the substrate; and a ferromagnetic layer directly contacting the metal layer; wherein there is not a second ferromagnetic layer directly contacting the metal layer. In an embodiment the metal layer has a metal layer thickness, a metal layer length, and a metal layer width, the ferromagnetic layer has a ferromagnetic layer thickness, a ferromagnetic layer length, and a ferromagnetic layer width that is longer than the ferromagnetic layer length, and the ferromagnetic layer length is shorter than the metal layer length. In an embodiment the metal layer width is shorter than the metal layer length. In an embodiment the ferromagnetic layer width is generally equal to the metal layer width. In an embodiment the ferromagnetic layer width is less than the metal layer width. In an embodiment the metal layer width has a first lateral boundary and a second lateral boundary, and the ferromagnetic layer extends beyond the first lateral boundary and does not extend beyond the second lateral boundary. In an embodiment the ferromagnetic layer thickness is no greater than 5 nm, the metal layer thickness is no less than 5 nm, and the ferromagnetic layer width is no less than 25 nm. In an embodiment the metal layer comprises at least one noble metal and at least one 5 d transition metal. In an embodiment the noble metal is at least one of platinum, copper, silver, and gold and the 5 d transition metal is at least one of lutetium, hafnium, tantalum, tungsten, rhenium, osmium, iridium, and mercury. In an embodiment the ferromagnetic layer includes at least one of nickel, cobalt, iron, and Huesler alloy. In an embodiment the metal layer comprises at least one noble metal and at least one 4 d transition metal, the noble metal includes at least one of platinum, tantalum, copper, silver, and gold, and the 4 d transition metal includes at least one of yttrium, zirconium, niobium, molybdenum, technetium, ruthenium, rhodium, palladium, silver, and cadmium. An embodiment comprises a select transistor on the substrate adjacent the metal layer, the select transistor having one of a source and a drain to electrically couple to the metal layer. An embodiment comprises a first contact directly connected to a first end of the metal layer, a second contact directly connected to a second end of the metal layer, a third contact directly connected to the second end of the metal layer, and a fourth contact directly connected to the ferromagnetic layer. In an embodiment the ferromagnetic layer is located between the first and second contacts. An embodiment a first contact directly connected to a first end of the metal layer; a first extension, comprising a second contact, that projects outwards from the metal layer; and a second extension, comprising a third contact, that projects outwards from the metal layer; wherein the ferromagnetic layer is located between the first and second contacts. In an embodiment the first and second extensions each extend away from the metal layer by an angle of at least 45 degrees, the second extension projects outwards from the metal layer in a direction generally opposite the first extension, and the metal layer and the first and second extensions are generally co-planar with one another. In an embodiment during a write operation charge current is supplied to the metal layer and induces spin current and a magnetic state within the magnet layer. In an embodiment during the write operation the charge current induces the spin current and the magnetic state based on Spin Hall Effect (SHE). In an embodiment the spin current is orthogonal to the charge current.

An embodiment includes a memory cell comprising: a substrate; a metal layer on the substrate; and a ferromagnetic layer on the metal layer; wherein there is no tunneling barrier between the metal and ferromagnetic layers and the metal layer comprises at least one noble metal and at least one transition metal. In an embodiment the metal layer has a metal layer thickness, a metal layer length, and a metal layer width, the ferromagnetic layer has a ferromagnetic layer thickness, a ferromagnetic layer length, and a ferromagnetic layer width that is longer than the ferromagnetic layer length, and the ferromagnetic layer length is shorter than the metal layer length. In an embodiment the metal layer width is shorter than the metal layer length. In an embodiment the ferromagnetic layer directly contacts the metal layer without using a via and the memory cell comprises a select transistor on the substrate having one of a source and a drain to electrically couple to the metal layer. An embodiment comprises a first contact directly connected to a first end of the metal layer; a first extension, comprising a second contact, that projects outwards from the metal layer; and a second extension, comprising a third contact, that projects outwards from the metal layer; wherein the ferromagnetic layer is located between the first and second contacts. In an embodiment during a write operation charge current is supplied to the metal layer and induces spin current and a magnetic state within the magnet layer and the charge current induces the spin current and the magnetic state based on Spin Hall Effect (SHE). In an embodiment the spin current is generally orthogonal to the charge current.

While the present invention has been described with respect to a limited number of embodiments, those skilled in the art will appreciate numerous modifications and variations there from. It is intended that the appended claims cover all such modifications and variations as fall within the true spirit and scope of this present invention.

What is claimed is:

1. A memory cell comprising:
   a substrate;
   a metal layer on the substrate; and
   a ferromagnetic layer directly contacting the metal layer;
   wherein (a) there is not a second ferromagnetic layer directly contacting the metal layer, and (b) the metal layer comprises at least one noble metal and at least one transition metal;
   wherein the metal layer has a metal layer thickness, a metal layer length, and a metal layer width, the ferromagnetic layer has a ferromagnetic layer thickness, a ferromagnetic layer length, and a ferromagnetic layer width that is longer than the ferromagnetic layer length, and the ferromagnetic layer length is shorter than the metal layer length.

2. The memory cell of claim 1, wherein the metal layer width is shorter than the metal layer length.

3. The memory of claim 1, wherein the ferromagnetic layer width is substantially equal to the metal layer width.

4. The memory cell of claim 1, wherein the ferromagnetic layer width is less than the metal layer width.

5. The memory cell of claim 1, wherein the metal layer width has a first lateral boundary and a second lateral boundary, and the ferromagnetic layer extends beyond the first lateral boundary and does not extend beyond the second lateral boundary.

6. The memory cell of claim 1, wherein the ferromagnetic layer thickness is no greater than 5 nm, the metal layer thickness is no less than 5 nm, and the ferromagnetic layer width is no less than 25 nm.

7. The memory cell of claim 1, wherein the noble metal is at least one of platinum, copper, silver, and gold and the transition metal is at least one of lanthanum, hafnium, tantalum, tungsten, rhenium, osmium, iridium, and mercury.

8. The memory cell of claim 7, wherein the ferromagnetic layer includes at least one of nickel, cobalt, iron, gadolinium, and Huesler alloy.

9. The memory cell of claim 1 wherein the noble metal includes at least one of platinum, copper, silver, and gold, and the transition metal includes at least one of yttrium, zirconium, niobium, molybdenum, technetium, ruthenium, rhodium, palladium, silver, and cadmium.

10. The memory cell of claim 9 comprising:
    a first contact directly connected to a first end of the metal layer; and
    a second contact directly connected to a second end of the metal layer;
    wherein the ferromagnetic layer is located between the first and second contacts.

11. The memory cell of claim 9, wherein during a read operation read current is supplied to both of the ferromagnetic and metal layers.

12. The memory cell of claim 1 comprising a first contact directly connected to a first end of the metal layer, a second contact directly connected to a second end of the metal layer, a third contact directly connected to the second end of the metal layer, and a fourth contact directly connected to the ferromagnetic layer.

13. The memory cell of claim 12, wherein the ferromagnetic layer is located between the first and second contacts.

14. The memory cell of claim 1 comprising:
    a first contact directly connected to a first end of the metal layer;
    a first extension, comprising a second contact, that projects outwards from the metal layer; and
    a second extension, comprising a third contact, that projects outwards from the metal layer;
    wherein the ferromagnetic layer is located between the first and second contacts.

15. The memory cell of claim 14, wherein the first and second extensions each extend away from the metal layer by an angle of at least 45 degrees, the second extension projects outwards from the metal layer in a direction substantially opposite the first extension, and the metal layer and the first and second extensions are substantially co-planar with one another.

16. The memory cell of claim 1, wherein during a write operation charge current is supplied to the metal layer and induces spin current and a magnetic state within the ferromagnetic layer.

17. The memory cell of claim 1, wherein during a read operation read current is supplied to both of the ferromagnetic and metal layers.

18. The memory cell of claim 1 comprising a contact, which couples to a read line, directly contacting the ferromagnetic layer.

19. A memory cell comprising:
a substrate;
a metal layer on the substrate; and
a ferromagnetic layer on the metal layer;
wherein there is no tunneling barrier between the metal and ferromagnetic layers and the metal layer comprises at least one noble metal and at least one transition metal;
wherein the metal layer has a metal layer thickness, a metal layer length, and a metal layer width, the ferromagnetic layer has a ferromagnetic layer thickness, a ferromagnetic layer length, and a ferromagnetic layer width that is longer than the ferromagnetic layer length, and the ferromagnetic layer length is shorter than the metal layer length.

20. The memory cell of claim 19, wherein the metal layer width is shorter than the metal layer length.

21. The memory cell of claim 19, wherein the ferromagnetic layer directly contacts the metal layer without using a via and the memory cell comprises a select transistor on the substrate having one of a source and a drain to electrically couple to the metal layer.

22. The memory cell of claim 19 comprising:
a first contact directly connected to a first end of the metal layer;
a first extension, comprising a second contact, that projects outwards from the metal layer; and
a second extension, comprising a third contact, that projects outwards from the metal layer.

23. The memory cell of claim 19, wherein during a write operation charge current is supplied to the metal layer and induces spin current and a magnetic state within the ferromagnetic layer and the charge current induces the spin current and the magnetic state based on Spin Hall Effect (SHE).

24. A memory cell comprising:
a substrate;
a metal layer on the substrate; and
a ferromagnetic layer directly contacting the metal layer;
wherein (a) there is not a second ferromagnetic layer directly contacting the metal layer, (b) the metal layer comprises at least one noble metal and at least one transition metal, and (c) during a read operation read current is supplied to both of the ferromagnetic and metal layers.

25. A memory cell comprising:
a substrate;
a metal layer on the substrate;
a ferromagnetic layer directly contacting the metal layer; and
a contact, which couples to a read line, directly contacting the ferromagnetic layer;
wherein (a) there is not a second ferromagnetic layer directly contacting the metal layer, and (b) the metal layer comprises at least one noble metal and at least one transition metal.

26. The memory cell of claim 25, wherein:
the noble metal is at least one of platinum, copper, silver, and gold;
the transition metal is at least one of lanthanum, hafnium, tantalum, tungsten, rhenium, osmium, iridium, mercury, yttrium, zirconium, niobium, molybdenum, technetium, ruthenium, rhodium, palladium, silver, and cadmium; and
the ferromagnetic layer includes at least one of nickel, cobalt, iron, gadolinium, and Huesler alloy.

* * * * *